United States Patent [19]
Ito et al.

[11] Patent Number: 4,810,526
[45] Date of Patent: Mar. 7, 1989

[54] METHOD OF COATING A RECRYSTALLIZED SILICON CARBIDE BODY WITH A COMPACT SILICON CARBIDE COATING

[75] Inventors: Toshiaki Ito; Masayoshi Yamaguchi; Kazunori Meguro, all of Nishi-Okitama, Japan

[73] Assignee: Toshiba Ceramics Co., LTD., Tokyo, Japan

[21] Appl. No.: 10,846

[22] Filed: Feb. 4, 1987

[30] Foreign Application Priority Data

Feb. 6, 1986 [JP] Japan .................. 61-24544

[51] Int. Cl.⁴ .................................. B05D 3/14
[52] U.S. Cl. .................................. 427/50; 427/51; 427/249; 427/255; 427/255.2
[58] Field of Search .......... 427/50, 249, 255, 255.4, 427/255.1, 255.2; 1/51

[56] References Cited

U.S. PATENT DOCUMENTS

| | | |
|---|---|---|
| 1,470,300 | 10/1923 | Szarvasy .................. 427/50 |
| 1,842,088 | 6/1926 | Eichenberger .................. 427/50 |
| 2,698,812 | 1/1955 | Schladitz .................. 427/50 |
| 3,406,044 | 10/1968 | Harris .................. 427/248.1 |
| 3,847,653 | 11/1974 | Roy et al. .................. 427/50 |
| 3,985,917 | 10/1976 | Krukonis .................. 427/50 |
| 4,107,352 | 8/1978 | Hakim .................. 427/50 |
| 4,215,154 | 7/1980 | Bechensky et al. .................. 427/50 |
| 4,401,689 | 8/1983 | Ban .................. 427/50 |
| 4,426,405 | 1/1984 | Hierholzer et al. .................. 427/50 |

FOREIGN PATENT DOCUMENTS

| | | | |
|---|---|---|---|
| 59-23072 | 5/1984 | Japan .................. | 427/249 |
| 1142080 | 2/1969 | United Kingdom .......... | 427/248.1 |

Primary Examiner—Sadie Childs
Attorney, Agent, or Firm—Cushman, Darby & Cushman

[57] ABSTRACT

A method of coating a surface of recrystallized silicon body by CVD method comprising a step of heating a feedstock gas containing a silicon source and a carbon source and said non-metallic element by a resistance heat which is generated by electrifying said non-metallic element.

7 Claims, 1 Drawing Sheet

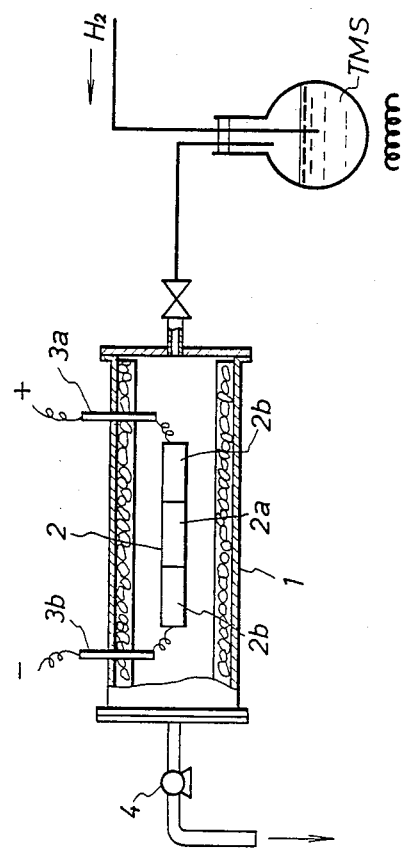

METHOD OF COATING A RECRYSTALLIZED SILICON CARBIDE BODY WITH A COMPACT SILICON CARBIDE COATING

DETAILED DESCRIPTION OF THE INVENTION

This invention relates to a method of coating an surface of a non-metallic elements by CVD method.

The non-metallic elements, for example, silicon carbide elements, which are a type of ceramic resistance element, have a coat of compact silicon carbide formed on the surface of the recrystallized silicon carbide body to a desired thickness by the CVD method for enhancing the atmospheric resistance characteristics.

Hitherto, for forming a coat of compact silicon carbide on the surface of a recrystallized silicon carbide body by the CVD method, there has been used a process in which, as for instance disclosed in Japanese Patent Publication No. 23072/84, a cylindrical graphite electrode and a recrystallized silicon carbide body (the body to be coated) are first placed concentrically with each other in a reaction tube, then a feedstock gas comprising a silicon source and a carbon source is introduced, in a pressure-reduced state, into the reaction tube and an induction coil adapted to the reaction tube is moved to heat the cylindrical graphite electrode continuously from end to end, thereby indirectly heating the recrystallized silicon carbide body and feedstock gas to the reaction temperature to form a compact silicon carbide coat on the surface of said recrystallized silicon carbide body.

According to such conventional coating method, however, since a coat is also formed on the surface of the cylindrical graphite electrode serving as a heat source, a waste of material is inevitable. Also, because heating applied to the cylindrical graphite electrode continuously from end to end, there tends to occur a non-uniform temperature distribution, resulting in non-uniform thickness of the coat on the recrystallized silicon carbide body.

The non-metallic elements usually consist of an exothermic portion and a terminal portion in which a conductive material (conductive silicon in the case of silicon carbide elements) is filled, so that in accordance with the conventional method, coating may be made on the terminal portion which needn't be coated.

Further, the conventional coating method had the problems of enlargement of the heating apparatus and much loss of energy.

The object of the present invention, therefore, is to provide a coating method for non-metallic elements which is capable of forming a coat of uniform thickness only at the part that needs to be coated, and which can also enable a reduction in size of the apparatus and a saving of energy.

Said object of the invention can be accomplished by a method of coating a surface of a non-metallic element by the CVD method comprising a step of heating a feedstock gas and said non-metallic element by resistance heat which is generated by electrifying of said non-metallic element.

According to the method of this invention, the exothermic portion of the non-metallic element to be coated generates heat to have a uniform temperature as said non-metallic element is electrified, whereby the feedstock gas is heated uniformly and the reaction product is deposited, that is, a coat is formed, to a uniform thickness on the surface of the exothermic portion of said non-metallic element.

The drawing is a schematic illustration of a coating system embodying the method of this invention.

Hereinafter, the method of this invention will be described by way of its embodiment illustrated in the drawing.

As shown in the drawing, four pieces of recrystallized silicon carbide body 2 (only one shown in the drawing) having an inner diameter of 20 mm, an outer diameter of 50 mm and a length of 1,100 mm are disposed in a reaction tube (furnace body) 1. The terminals 2b at both ends of each recrystallized silicon carbide body 2 are connected to the electrodes 3a and 3b, respectively, and then the furnace is evacuated by a vacuum pump 4 until the pressure in the furnace becomes 1.0 Torr or below.

Thereafter, the electrodes 3a, 3b are connected to the power to apply an electric current to the terminals 2b of each recrystallized silicon carbide body 2, causing the exothermic portion 2a at the center of said silicon carbide body 2 to generate resistance heat to have a surface temperature of 1,400° C., and then trichloromethylsilane (TMS) (feedstock gas) carried by hydrogen gas as a carrier is introduced into the reaction tube 1 so that the pressure in the furnace becomes 38 Torr. By maintaining this condition for about one hour, there can be obtained a silicon carbide element having a coat of compact silicon carbide.

In this embodiment of the invention, the thickness of the coat of the obtained silicon carbide element was 250 μm, and the scatter of the coat thickness at the exothermic portion 2a in the longitudinal direction was ±20 μm, which is far smaller and more uniform than the scatter of ±100 μm observed in the conventional method by indirect heating.

Also, the power consumption in the above embodiment of the invention was approximately 20 kWH, which is about ⅓ of the power consumption (60 KWH) required in the conventional method by indirect heating for forming a 250 μm thick coat on the same number of recrystallized silicon carbide bodies of the same size as used in said embodiment of the invention.

The above-described method of this invention has the following advantages over the conventional method.

(1) Since the exothermic portion of a non-metallic element and the feedstock gas are both heated to a uniform temperature by the electrification of said non-metallic element, the deposition of the reaction product takes place uniformly in thickness on the surface of said exothermic portion, and therefore the scatter of coat thickness at the exothermic portion in its longitudinal direction is almost eliminated.

(2) Since heat is generated at the exothermic portion alone by the electrification of the non-metallic element and the terminal portions are not heated to a temperature suited for coating, no coating is made on the terminal portions which needn't be coated and therefore the material can be used effectively.

(3) Since the cylindrical graphite electrode and the induction coil required in the conventional method are unnecessitated, a reduction in size of the reaction tube and accordingly the miniturization of the whole apparatus is made possible.

(4) Since heating of the feedstock gas, etc., is effected by heat generation of the non-metallic element itself, the loss of heat energy is minimized and the energy consumption is reduced to ⅓ or less of the conventional method, thus enabling a marked improvement of the energy saving effect.

What is claimed is:

1. A method of coating a recrystallized silicon carbide body with a compact silicon carbide by chemical vapor deposition comprising the following steps:
    disposing said recrystallized silicon carbide body in a furnace;
    lowering the pressure in said furnace to a first pressure of not more than 1.0 Torr;
    heating said silicon carbide body by electric resistance;
    introducing a feedstock gas containing at least a silicon source and a carbon source, said feedstock gas contacting said silicon carbide body and becoming heated;
    increasing the pressure in said furnace to a second pressure maintained for a predetermined period of time sufficient to obtain a silicon carbide element having a coat of compact silicon carbide.

2. The method of claim 1 wherein said heating step, said recrystallized silicon carbide body has an exothermic center portion and two ends, each end containing electrically conductive silicon, each end being a terminal respectively connected to electrodes of an electric power supply.

3. The method of claim 1 wherein said heating step, said silicon carbide body has a surface temperature of about 1,400° C.

4. The method of claim 1 wherein said pressure increasing step, said second pressure is about 38 Torr.

5. The method of claim 1 wherein said pressure increasing step, said predetermined period of time is about one hour.

6. The method of claim 1 wherein said pressure increasing step, said coat of compact silicon carbide is about 250 μm thick.

7. The method of claim 2 wherein said exothermic center portion is coated with compact silicon carbide and the scatter of the coating from the periphery of said center portion is ±20 μm.

* * * * *